Nov. 17, 1970 W. R. CARDWELL ET AL. 3,541,396

SUPPORT FRAMES FOR PLANAR CIRCUIT BOARDS

Filed Jan. 16. 1969

INVENTORS.
WILLIAM R. CARDWELL
LLOYD E. JOHNSON
DENIS E. LOWRY
PAUL L. O'BRIAN
DAVID C. SHATTUCK

BY John W Girvin, Jr.
ATTORNEY.

3,541,396

SUPPORT FRAMES FOR PLANAR CIRCUIT BOARDS

William R. Cardwell, Lloyd E. Johnson, Denis E. Lowry, Paul L. O'Brian, and David C. Shattuck, Lexington, Ky., assignors to International Business Machines Corporation, Armonk, N.Y., a corporation of New York Filed Jan. 16, 1969, Ser. No. 791,682
Int. Cl. H05k *1/14, 7/18*
U.S. Cl. 317—101 7 Claims

ABSTRACT OF THE DISCLOSURE

An open support structure for supporting a plurality of planar circuit boards for shipment and for machine mounting. The support structure resiliently clamps the circuit boards therebetween and provides air channels for convection cooling. A rigid cross-over connector electrically connects the circuit boards to one another to provide common voltage and signal sources. Connector retainers are incorporated into the structure to secure input/output connector cables.

CROSS-REFERENCES TO RELATED APPLICATIONS

The following application is assigned to the same assignee as the present application.

U.S. patent application Ser. No. 15,002, entitled "Control Console," Eliot F. Noyes, inventor, filed Dec. 16, 1968 now U.S. Pat. D. 215,938 issued Nov. 11, 1969.

BRIEF BACKGROUND OF INVENTION

Field

This invention relates to a planar circuit board support structure adapted to support circuit boards when they are mounted in a machine environment and when they are being shipped outside of the machine environment.

Description of the prior art

Prior art business machines and other similar machines incorporating many transistorized circuits utilize circuit boards on which discrete components and small scale integrated circuits are mounted. These circuit boards are in turn mounted in a support structure and are usually designed so that the circuit boards can be accessed and replaced by a repairman. The prior art support structures fall into two general categories: support structure for supporting relatively small circuit boards and support structure for supporting relatively large circuit boards. The support structure for supporting relatively small circuit boards generally comprises a plurality of socket members each adapted to receive a single circuit board. The socket members are mounted in rows and columns and supported by a frame member which is generally fixedly secured to the machine frame. In order to repair an electronic failure, the repairman narrows down the machine malfunction to a given circuit board and replaces that circuit board. When intermittent electronic failures occur within the electronic circuitry, the time necessary to repair the device by replacing a malfunctioning part can take many hours. In some instances, where a problem is persistent and not readily solved, the repairman effects a massive replacement of all of the parts either by the time consuming process of replacing each circuit board individually, or by removing the frame member which supports the socket members from the machine frame and replacing it with another frame member containing new parts. None of the prior art frame members provide adequate protection for the circuit boards when they are removed from the machine frame since many of the circuit boards are exposed and can readily be damaged if the frame member is accidentally dropped or hit with another object.

In order to avoid some of the above enumerated shortcomings of prior art devices utilizing a great plurality of relatively small circuit boards, prior art business machines have utilized a smaller number of relatively large circuit boards. These relatively large circuit boards are usually fixedly secured to machine frame supporting members. The supporting members are generally shock mounted within the machine frame to minimize the effect of machine vibrations on the components mounted on the circuit boards. These frame members are not adapted to be removed from the machine and, in order to replace the circuit boards, it is necessary to remove the various clamping and securing devices which fixedly mount the circuit board to the machine frame. Once such a large size circuit board has been removed from the machine frame, extreme care must be taken to insure that the circuit board is not thereafter damaged. Further, the support structure utilized to support large scale circuit boards is generally mounted for relative motion with respect to the machine frame so that the circuit board may be accessed for servicing when the structure is in one relative position and be placed in an array of similar circuit boards for maximum packing density within the machine frame when the support structure is in another relative position. Thus, the support frames generally tend to be heavy and bulky and add a relatively great amount of weight to the machine structure.

SUMMARY

In order to overcome the above problems and shortcomings of the prior art and to provide a light weight circuit board support structure adapted to support a plurality of relatively large sized circuit boards and adapted to protect the circuit boards when they are removed from the machine frame, a unique circuit board support structure is provided to resiliently clamp each of a plurality of circuit boards between two supporting structures. These supporting structures include channel forming support members enabling the circuits to be cooled by air convection and are adapted to surround the circuit boards to provide protection for the boards when they are removed from the machine environment. Openings are provided within the supporting members to facilitate air cooling of the electronic parts. Additionally, a cable connector retainer is provided for positively securing connecting cables to the support member in order to prevent relative motion between the connecting cables and the circuit boards. Additionally, a printed circuit cross-over connector is utilized to provide common supply voltages and signals to each of the plurality of circuit boards. The circuit boards and their supporting structures may be rapidly removed from the machine and thereafter shipped to a remote location for testing. At the testing location, the circuit boards may be readily disassembled from the support structure and then rapidly reassembled.

The foregoing and other features and advantages of the invention will be apparent from the following more particular description of the preferred embodiment of the invention as illustrated in the accompanying drawing.

Figures 1, 2, 3:
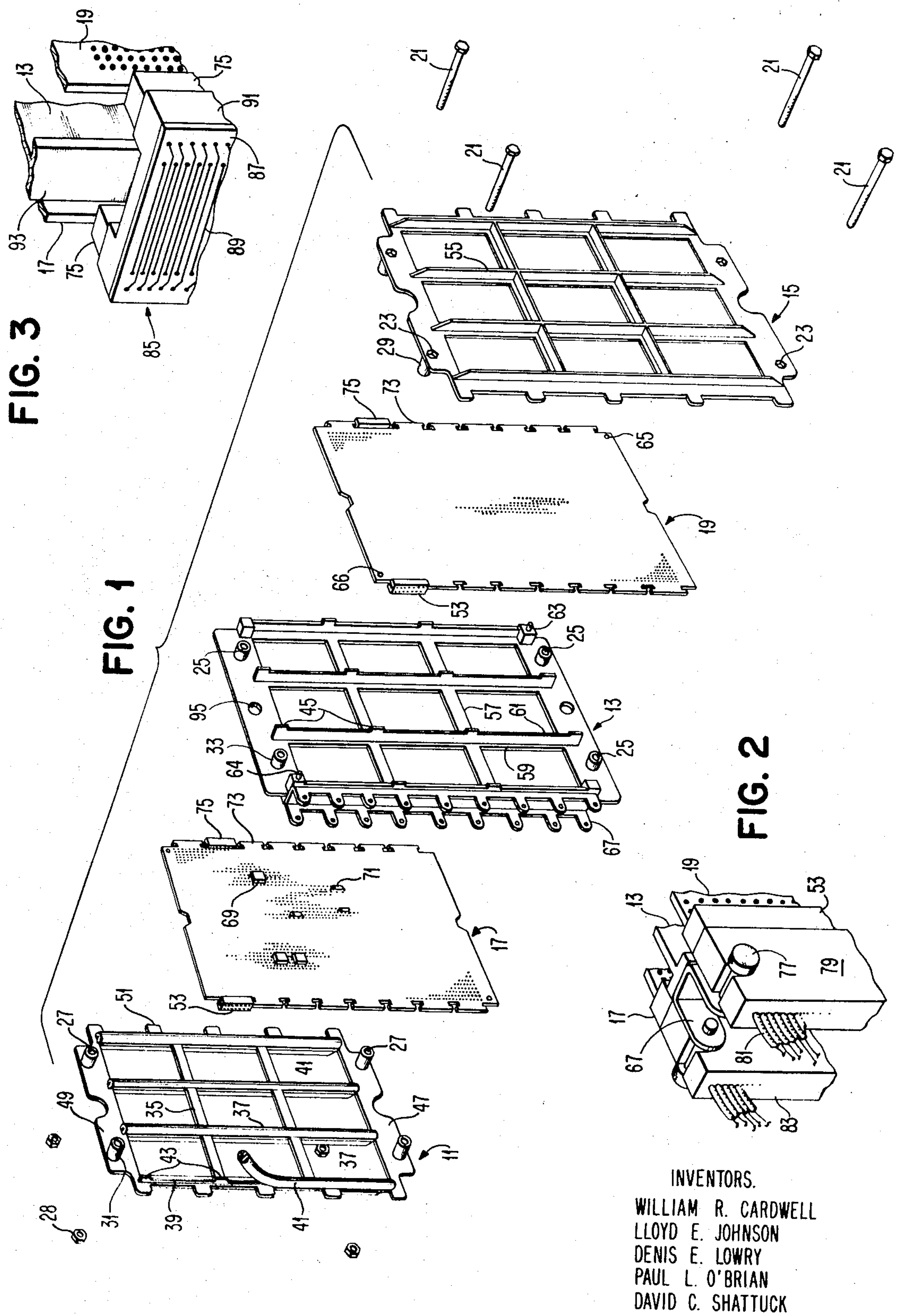
FIG. 1 is an exploded perspective view of the planar circuit board support structure and the planar circuit boards adapted to be supported thereby.
FIG. 2 is a partial perspective view of the input/output cable connector retainer and associated cable connectors.
FIG. 3 is a partial perspective view of a printed circuit cross-over connector.

Referring now to the drawings, and more particularly to FIG. 1 thereof, an exploded perspective view of the planar circuit board support structure of the present invention is depicted. The support structure comprises an outside support member 11, an inside support member 13 and a second outside support member 15. Two circuit boards, 17 and 19, are each located between the inside support member 13 and an outside support member. When assembled, screws 21 pass through holes 23 of the second outside support member 15, holes 25 of the inside support member 13 and holes 27 of the outside support member 11 and are secured by bolts 28. Spacers 29, 31, and 33 prevent the bolts from being torqued down too heavily thereby regulating the clamping action of the support members against the circuit boards trapped therebetween.

The outside support member 11 is a molded plastic structure made of a thermosetting filled penolic resin and consists of a grid-like pattern of horizontal members 35 and vertical members 37. The vertical members 37 each include a raised channel forming member 39 for receiving a soft rubber bumper 41 which is mounted thereon. At the intersection of each horizontal member 35 and vertical member 37, the raised channel forming members 39 contain projections 43 over which the soft rubber bumper is mounted. The projections 43 align with corresponding projections 45 located on each side of the inside support member and are adapted to provide a clamping action on the circuit boards when they are assembled between the support members. The bottom-most portion 47 and top-most portion 49 of the outside support member 11 extend below and above, respectively, the bottom-most and top-most surfaces of an adjacent circuit board when assembled to prevent the circuit board from being damaged in handling. It has been found that support members 16¼″ long adequately protect circuit boards 15″ long. Earlike projections 51 extend beyond the contact shrouds 53 mounted on the circuit board to prevent damage to the sides of the circuit board while still providing ready access to the contact shrouds. It has been found that earlike projections of approximately ⅜″ in depth formed on a support member 9¼″ wide adequately protect a symmetrically mounted circuit board 9″ in width.

The second outside support member 15 is identical to the outside support member 11. Rail-like projections 55 are formed on the backside of the outside support members to provide additional light weight structural strength.

The inside support member 13 is similar in construction to the outside support members in that it is made of plastic and consists of a grid-like structure of horizontal members 57 and vertical members 59. The vertical members contain raised channel forming members 61 having projections 45 thereon as has been described. When assembled, the projections 45 engage the surface of the circuit board 19, while similar projections (not shown) located on the reverse side of the inside support member engage the surface of the circuit board 17. The projections enable horizontal wires to be added to the surface of the circuit boards and run over the raised channel forming members 61.

Locating pins 63 and 64 are adapted to engage holes 65 and 66 of the circuit board 19 to precisely locate the circuit board with respect to the support members. A connector retainer 67 is mounted to the inside support member 13 and is adapted to fixedly support cable connectors which connect to the contact shrouds 53 located on the circuit boards 17 and 19.

The circuit boards 17 and 19 are made of a glass epoxy laminate structure containing a plurality of plated through holes adapted to receive integrated circuit modules 69 and discrete components 71. Printed circuit patterns (not shown) are located on either side of the circuit boards 17 and 19 and connect the modules and components to one another. The modules and components are mounted on one side of the circuit boards and aligned so that they will not be adjacent to the vertical rail-like projections 55 of the inside support member 13 when the support structure is assembled. Each circuit board has a series of tab-like projections 73 containing a plurality of bare contacts (not shown). Contact shrouds 53 and 75 clamp over the bare contacts to provide a plurality of pin sockets for off the circuit board connections and inter-circuit board connections respectively.

Referring now to FIG. 2 of the drawings, a partial perspective view of the input/output cable connector retainer and its associated input/output cables are depicted. The connector retainer 67 is fixedly mounted to the inside support member 13. Screw 77 fits through an opening in the crimp pin connector block 79 and screws into the connector retainer 67. A plurality of wires 81 leading to other machine components are fitted into the crimp pin connector block and are each terminated with a pin connector which is adapted to plug into the holes located in the contact shroud 53. The contact shroud 53 is in turn mounted on the circuit board 19. A crimp pin connector block 83 is mounted in a similar manner to the connector retainer 67 and engages the printed circuit board 17.

Referring now to FIG. 3 of the drawings, a partial perspective view of the printed circuit cross-over connector of the present invention is depicted. The printed circuit cross-over connector 85 consists of a rigid printed circuit board 87 having printed circuit wires 89 located thereon. A plurality of pin terminals (not shown) are mounted to the opposite side of the printed circuit board 87 so as to form a conductive path with each side of the printed circuit wires 89. The pin terminals are located within a plastic pin carrying member 91 and are adapted to plug into the contact shrouds 75 which are mounted on the printed circuit boards 17 and 19. The inside support member 13 provides a surface 93 over which the pin carrying member 91 fits. When assembled, the ear-like projections 51 of the outside support members of FIG. 1 extend beyond the outermost surface of the rigid printed circuit board 87.

Referring now once again to FIG. 1 of the drawings, when it is desired to assemble the support members and the circuit boards, the holes 65 and 66 of the circuit boards are placed on the locating pins 63 and 64 of the inside support member 13. Thereafter, the screws 21 are placed through the holes 23 of the second outside support member 15 and the holes 25 of the inside support member 13. Thereafter, the circuit board 17, mounted to the inside support member 13 in a manner similar to that described with respect to circuit board 19 and the screws 21 are placed through the holes 27 of the outside support member 11. Bolts 28 are then tightened down over the screws, the spacers 29, 31, and 33 insuring the desired fit. It has been found that support members spaced approximately one inch apart provide adequate ventilation for the circuit boards.

When assembled in this manner, the soft rubber bumpers 41 of the outside support members 11 and 15 engage the outermost surfaces of the circuit boards 17 and 19 respectively and the projections 45, located on the inside support member 13, engage the inside surfaces of the circuit boards. It will be recalled that a plurality of projections 43 are located under the soft rubber bumpers 41 and aligned with the projections 45 to provide small area contact points. Since the circuit boards are subjected to various soldering operations, the boards are not completely planar, there being irregularities in the surface thereof. Thus, by providing small area contact points, the point of contact of the circuit boards with the support structure can be located precisely for maximum vibration dampening effect.

The soft rubber bumpers 41, located on the outside support members, prevent vibrations from being transmitted from the machine frame to the circuit boards 17 and 19 while rigidly supporting the boards. Thus, circuit board life is extended because destructive vibrations are dampened out prior to reaching the boards. As the entire rubber bumper contacts the surface of the circuit board, that portion of the rubber bumper located between the projections 43 also tends to dampen out vibrations. It has been found, however, that adequate vibration dampening can be effected by providing a plurality of small rubber hemisphere shaped contact members located where the projections 43 are located.

When the support structure is assembled, the raised channel forming members 39 and the soft rubber bumpers 41 mounted thereon, form parallel vertical channels adjacent to the outside surfaces of the circuit boards 17 and 19. In a similar manner, the raised channel forming members 61 form parallel vertical channels with the inside surfaces of the circuit boards 17 and 19. These vertical channels enable convection cooling of the electronic circuits mounted on the circuit boards since the heated air moves upwardly through the vertical channels. There is virtually no air flow between channels. It has been found that for two electronic circuit boards which together dissipate about 14 watts and which are mounted inside of a structure similar to that disclosed in the aforereferenced copending application to Eliot F. Noyes, the addition of blowers and fans is not necessary to aid in the dissipation of the heat energy generated by the electronic circuits. Once the support members have been assembled, the printed circuit cross-over connectors 85 of FIG. 3 are plugged into the contact shrouds 75. Thus assembled, the entire unit is adapted for shipping to remote locations for use as a replacement part. Since the circuit boards are shock mounted within the support members, vibrations transmitted to the circuit boards during shipment are minimized.

The assembled unit may thereafter be inserted into a machine by placing the lower surface of the inside support member 13 within a shallow channel member (not shown) mounted to the machine frame and by fastening the upper surface of the inside support member 13 to a machine frame member with a screw passing through hole 95. A rubber grommet can be inserted into the hole 95 to reduce the transmission of machine vibrations to the inside support member 13. Additionally, the channel member on the machine frame can be lined with a resilient material to additionally reduce transmitted machine vibrations. With the unit thus mounted, the crimp pin connector blocks 79 of FIG. 2 are thereafter inserted into the contact shrouds 53 and fastened to the connector retainer 67.

The ability to rapidly insert, disconnect, and ship large quantities of electronic circuits from the machine facilitates rapid servicing thereof by relatively unskilled technicians. Additionally, damage to the delicate electronic components during shipment thereof either within a machine environment or outside of a machine environment is minimized as the components and connections are protected from direct blows by the supporting members and are shock mounted to reduce and dampen transmitted vibrations. Additionally, the light weight of the unit enables its shipment at relatively low costs.

As is apparent to those skilled in the art, additional inside support members can be utilized when it is desirous to include more than two circuit boards within a unit package. In order to incorporate additional inside support members, the additional inside support members are constructed so that one surface thereof is similar to the inside surfaces of the outside support members 11 and 15. That is, they contain the soft rubber bumper structure on one side thereof. An additional modification which may be made to the unit is to utilize dome shaped rubber bumpers attached to the projections 43 on the outside support member 11 in lieu of the soft rubber bumpers 41. These dome shaped rubber bumpers are sufficient to shock mount the circuit boards, although the additional dampening effected by the soft rubber bumper along the entire vertical surface of the raised channel forming members 39 is, of course, eliminated with this configuration. A further modification would be the utilization of flexible connecting cables between circuit boards and the use of retaining members to secure the cross-over connections. Additionally, the resilient means can be mounted on the inside support member(s).

While the invention has been particularly shown and described with reference to the preferred embodiment thereof, it should be understood by those skilled in the art that the foregoing and other changes in form and detail may be made therein without departing from the spirit and scope of the invention.

What is claimed is:

1. A support unit for supporting a plurality of planar circuit boards in stacked relation to one another comprising:

first and second outside support members each having a plurality of raised contact surfaces on one side thereof for contacting the surface of an adjacent circuit board and a plurality of raised substantially vertical channel forming members located on said one side thereof, said outside support members each being dimensionally larger than said adjacent circuit boards;

at least one inside support member having a plurality of raised surfaces on each side thereof for contacting the surfaces of adjacent circuit boards in an aligned relation to the raised contact surfaces of said outside support members and further having a plurality of raised substantially vertical channel forming members located on each side thereof;

at least either said plurality of raised contact surfaces or said plurality of raised surfaces being resilient;

clamping means for clamping said outside support members to each other and for trapping circuit boards between the clamped outside support members and the at least one inside support member, contact surfaces of said outside support members and the raised surfaces of said at least one inside support member supporting circuit boards trapped therebetween.

2. The support unit set forth in claim 1 further comprising:

a plurality of cable terminals;

a plurality of circuit boards, said circuit boards being supported by said support unit and having cable connection terminals engaging said cable terminals;

and connector retaining means fixedly secured to said at least one inside support member for fixedly securing said cable terminals thereto.

3. The support unit set forth in claim 1 further comprising:

a plurality of circuit boards, said circuit boards being supported by said support unit;

circuit board terminal means secured to said circuit boards for receiving connector terminal means;

cross-over connector means having first connector terminal means for engaging said circuit board terminal means of one of said circuit boards, second connector terminal means for engaging the circuit board terminal means of another of said circuit boards and a rigid printed circuit board fixedly secured between said first and said second connector terminal means for providing electrical connections between said first and said second connector terminal means.

4. The support unit set forth in claim 2 further comprising:

circuit board terminal means secured to said circuit boards for receiving connector terminals;

cross-over connector means having first connector terminal means for engaging said circuit board terminal means of one of said circuit boards, second connector terminal means for engaging the circuit board terminal means of another of said circuit boards and a rigid printed circuit board fixedly secured between said first and said second connector terminal means for providing electrical connections between said first and said second connector terminal means.

5. The support unit set forth in claim 1 wherein said raised contact surfaces comprise a plurality of elongated resilient strips mounted to said raised channel-forming members and wherein each of said raised channel-forming members contain a plurality of projections for supporting the surface of an adjacent circuit board.

6. The support unit set forth in claim 1 further comprising:

a plurality of spacer means for fixedly engaging one of said outside support members and said at least one inside support member for regulating the spacial distance between said engaged support members.

7. The support unit set forth in claim 1 wherein said outside support members and said at least one inside support member each having a plurality of openings therein allowing air to pass therethrough to channels formed by said channel forming members.

References Cited

UNITED STATES PATENTS

| | | | |
|---|---|---|---|
| 3,258,649 | 6/1966 | Arguin | 317—101 |
| 3,272,909 | 9/1966 | Brock | 317—101 |

LEWIS H. MYERS, Primary Examiner

G. P. TOLIN, Assistant Examiner

U.S. Cl. X.R.

317—119